(12) United States Patent  
Cheung et al.

(10) Patent No.: US 8,753,714 B2
(45) Date of Patent: Jun. 17, 2014

(54) FORMING OR PATTERNING COMPOSITE MICROSTRUCTURES USING MICROFLUIDICS

(75) Inventors: Yuk Kee Cheung, Sai Wan Ho (HK); Samuel Sia, New York, NY (US)

(73) Assignee: The Trustees of Columbia University in the City of New York, New York, NY (US)

( * ) Notice: Subject to any disclaimer, the term of this patent is extended or adjusted under 35 U.S.C. 154(b) by 1722 days.

(21) Appl. No.: 12/080,256

(22) Filed: Apr. 1, 2008

(65) Prior Publication Data

US 2008/0286482 A1    Nov. 20, 2008

Related U.S. Application Data

(60) Provisional application No. 60/921,357, filed on Apr. 2, 2007.

(51) Int. Cl.
*B05D 7/22*    (2006.01)
*B05D 3/06*    (2006.01)

(52) U.S. Cl.
USPC .......................................... 427/230; 427/508

(58) Field of Classification Search
CPC ................... G01B 9/02042; G02B 21/0024
USPC ................... 427/230, 508; 436/501
See application file for complete search history.

(56) References Cited

PUBLICATIONS

Albrecht et al., "Photo- and electroplating of hydrogel-encapsulated living cell arrays," Lab Chip, 2005, 5, 111-118.*

Hahn et al., "Photolithographic patterning of polyethylene glycol hydrogels," Biomaterials 27 (2006) 2519-2524.*
Linder et al., "Reagent-Loaded Cartridges for Valveless and Automated Fluid Delivery in Microfluidic Devices," Anal. Chem. 2005, 77, 64-71.*
Sia et al., "Review: Microfluidic devices fabricated in poly(dimethylsiloxane) for biological studies," Electrophoresis 2003, 24, 3563-3576.*
Sia et al., "An Integrated Approach to a Portable and Low-Cost Immunoassay for Resource-Poor Settings," Angew. Chem. Int. Ed. 2004, 43, 498-502.*
Beebe et al., "Functional hydrogel structures for autonomous flow control inside microfluidic channels," Nature, vol. 404, Apr. 6, 2000, pp. 588-590.*
Cheung et al., "Direct patterning of composite biocompatible microstructures using microfluidics," Lab Chip, 2007, 7, 574-579.*
Albrecht et al., "Photo- and electropatterning of hydrogel-encapsulated living cell arrays," Lab on a Chip, 2005, 5:111-118.

(Continued)

*Primary Examiner* — William Phillip Fletcher, III
(74) *Attorney, Agent, or Firm* — Mark A. Catan; Miles & Stockbridge P.C.

(57) ABSTRACT

Techniques comprising systems and methods for forming or patterning microstructures using microfluidics are described. A target structure can include a microchannel passage with a chamber into which a light hardenable material can be injected and selectively exposed to light to adhere to a desired location of a substrate. Unhardened material can be washed out of the chamber. One or more subsequent cycles can repeat the process using the same or a different material. A variety of composite microstructures can be created, including structures encapsulating viable living cells, such as for cell study or tissue engineering.

12 Claims, 9 Drawing Sheets
(5 of 9 Drawing Sheet(s) Filed in Color)

(56) References Cited

PUBLICATIONS

Albrecht et al., "Probing the role of multicellular organization in three-dimensional microenvironments," Nature Methods, Apr. 2006, 3(5): 369-375.

Alcaraz et al., "Laminin and biomimetic extracellular elasticity enhance functional differentiation in mammary epithelia," The EMBO Journal, Nov. 2008, 27(21):pp. 2829-2838.

Almany et al., "Biosynthetic hydrogel scaffolds made from fibrinogen and polyethylene glycol for 3D cell cultures," Biomaterials, 2005, 26:pp. 2467-2477.

Balazs et al., "Nanoparticle Polymer Composites: Where Two Small Worlds Meet," Science, Nov. 2006, 314(5802): 1107-1110.

Balooch et al., "TGF-β regulates the mechanical properties and composition of bone matrix," Proceedings of the National Academy of Sciences of the United States of America, 2005, 102(52):pp. 18813-18818.

Beebe et al., "Functional Hydrogel Structures for Autonomous Flow Control Inside Microfluidic Channels," Nature, Apr. 2000, 404:pp. 588-590.

Burdick et al., "Controlled Degradation and Mechanical Behavior of Photopolymerized Hyaluronic Acid Networks," Biomacromolecules, 2005, 6(1):pp. 386-391.

Cheung et al., "Direct patterning of composite biocompatible microstructures using microfluidics," Lab on a Chip, 2007, 7: 574-579.

Cheung et al., "Microfluidics-based Lithography for Fabrication of Multi-Component Biocompatible Microstructures," in: Herold et al., Lab-on-a-Chip Technology (vol. 1): Fabrication and Microfluidics (Caister Academic Press, 2009), Chapter 7.

Costa et al., "Analysis of Indentation: Implications for Measuring Mechanical Properties With Atomic Force Microscopy," Journal of Biomechanical Engineering, 1999, 121:pp. 462-471.

Costa, K.D., "Single-cell elastography: Probing for disease with the atomic force microscope," Disease Markers, 2004, 19(2-3):pp. 139-154.

Dendukuri et al., "Continuous-flow lithography for high-throughput microparticle synthesis," Nature Materials, 2006, 5(5):pp. 365-369.

Dendukuri et al., "Stop-flow lithography in a microfluidic device," Lab on a Chip, 2007, 7: 818-828.

Dendukuri et al., "Synthesis and self-assembly of amphiphilic polymeric microparticles," Langmuir, 2007, 23(8): 4669-4674.

Deroanne et al., "In vitro tubulogenesis of endothelial cells by relaxation of the coupling extracellular matrix-cytoskeleton," Cardiovascular Research, Feb. 2001, 49(3):pp. 647-658.

Di Benedetto et al., "Two dimensional patterning of fluorescent proteins in hydrogels," Langmuir, 2006, 22(1): 29-31.

Dikovsky et al., "Defining the Role of Matrix Compliance and Proteolysis in Three-Dimensional Cell Spreading and Remodeling," Biophysical Journal, Apr. 2008, 94(7):pp. 2914-2925.

Discher et al., "Tissue Cells Feel and Respond to the Stiffness of Their Substrate," Science, 2005, 310: 1139-1143.

Elkin et al., "Mechanical Heterogeneity of the Rat Hippocampus Measured by Atomic Force Microscope Indentation," Journal of Neurotrama, 2007, 24(5): pp. 812-822.

Engler et al., "Matrix Elasticity Directs Stem Cell Lineage Specification," Cell, 2006, 126(4):pp. 677-689.

Engler et al., "Substrate Compliance versus Ligand Density in Cell on Gel Responses," Biophysical Journal, 2004, 86(1):pp. 617-628.

Fukuda et al., "Micropatterned cell co-cultures using layer-by-layer deposition of extracellular matrix components," Biomaterials, Mar. 2006, 27(8): 1479-1486.

Gates et al., "New approaches to nanofabrication: Molding, printing, and other techniques," Chemical Reviews, 2005, 105(4): 1171-1196.

Gillette et al., "In situ collagen assembly for integrating microfabricated three-dimensional cell-seeded matrices," Nature Materials, 2008, 7(8):pp. 636-640.

Gobin et al., "Cell migration through defined, synthetic extracellular matrix analogues," Journal of the Federation of American Societies for Experimental Biology, 2002, 16:pp. 751-753.

Grayson et al., "A BioMEMS review: MEMS technology for physiologically integrated devices," Proceedings of the IEEE, Jan. 2004, 92(1): 6-21.

Griffith et al., "Capturing complex 3D tissue physiology in vitro," Nature Review: Molecular Cell Biology, Mar. 2006, 7(3): 211-224.

Hahn et al., "Laser scanning lithography for surface micropatterning on hydrogels," Advanced Materials, 2005, 17(24): 2939-2942.

Hahn et al., "Photolithographic patterning of polyethylene glycol hydrogels," Biomaterials, 2006, 27: 2519-2524.

Halstenberg et al., "Biologically Engineered Protein-graft-Poly(ethylene glycol) Hydrogels: A Cell Adhesive and Plasmin-Degradable Biosynthetic Material for Tissue Repair," Biomacromolecules, 2002, 3(4):pp. 710-723.

Hern et al., "Incorporation of adhesion peptides into nonadhesive hydrogels useful for tissue resurfacing," Journal of Biomedical Materials Research Part A, 1998, 39(2): 266-276.

Kane, R.S., "Fabricating Complex Polymeric Micro- and Nanostructures: Lithography in Microfluidic Devices," Angewandte Chemie International Edition, 2008, 47(8):pp. 1368-1370.

Khademhosseini et al., "A soft lithographic approach to fabricate patterned microfluidic channels," Analytical Chemistry, 2004, 76(13): 3675-3681.

Khademhosseini et al., "Direct Patterning of protein- and cell-resistant polymeric monolayers and microstructures," Advanced Materials, 2003, 15(23): 1995-2000.

Khademhosseini et al., "Microscale Technologies for Tissue Engineering and Biology," Proceedings of the National Academy of Sciences of the United States of America, 2006, 103: 2480-2487.

Lee et al., "Microfluidic alignment of collagen fibers for in vitro cell culture," Biomedical Microdevices, Mar. 2006, 8(1): 35-41.

Lei et al., "High-resolution technique for fabricating environmentally sensitive hydrogel microstructures," Langmuir, 2004, 20(21): 8947-8951.

Leong et al., "Spatially Controlled Chemistry Using Remotely Guided Nanoliter Scale Containers," Journal of the American Chemical Society, 2006, 128(35): 11336-11337.

Lo et al., "Cell Movement Is Guided by the Rigidity of the Substrate," Biophysical Journal, Jul. 2000, 79(1): pp. 144-152.

Lutolf et al., "Synthetic matrix metalloproteinase-sensitive hydrogels for the conduction of tissue regeneration: engineering cell-invasion characteristics," Proceedings of the National Academy of Sciences of the United States of America, Apr. 2003, 100(9): 5413-5418.

Mann et al., "Smooth muscle cell growth in photopolymerized hydrogels with cell adhesive and proteolytically degradable domains: synthetic ECM analogs for tissue engineering," Biomaterials, 2001, 22 (22): 3045-3051.

Miller et al., "Laser-scanning lithography (LSL) for the soft lithographic patterning of cell-adhesive self-assembled monolayers," Biotechnology and Bioengineering, 2006, 93(6): 1060-1068.

Mow et al., Basic Orthopaedic Biomechanics, Lippincort-Raven, 1997, pp. 113-177.

Nelson et al., "Tissue Geometry Determines Sites of Mammary Branching Morphogenesis in Organotypic Cultures," Science, 2006, 314: 298-300.

Nuttelman et al., "Synthetic hydrogel niches that promote hMSC viability," Matrix Biology, 2005, 24(3): 208-218.

Panda et al., "Stop-flow lithography to generate cell-laden microgel particles," Lab on a Chip, 2008, 8: 1056-1061.

Parker et al., "Extracellular matrix, mechanotransduction and structural hierarchies in heart tissue engineering," Philosophical Transactions of the Royal Society B: Biological Sciences, 2007, 362(1484): pp. 1267-1279.

Paszek et al., "Tensional homeostasis and the malignant phenotype," Cancer Cell, Sep. 2005, 8(3):pp. 241-254.

Paszek et al., "The Tension Mounts: Mechanics Meets Morphogenesis and Malignancy," Journal of Mammary Gland Biology and Neoplasia, Oct. 2004, 9:pp. 325-342.

Pelham et al., "Cell locomotion and focal adhesions are regulated by substrate flexibility," Proceedings of the National Academy of Sciences of the United States of America, Dec. 1997, 94(25): 13661-65.

(56) References Cited

OTHER PUBLICATIONS

Pregibon et al., "Multifunctional encoded particles for high-throughput biomolecule analysis," Science, Mar. 2007, 315(5817): 1393-1396.

Rains et al., "Mechanical properties of human tracheal cartilage," Journal of Applied Physiology, 1992, 72:pp. 219-225.

Rho et al., "Microstructural elasticity and regional heterogeneity in human femoral bone of various ages examined by nano-indentation," Journal of Biomechanics, 2002, 35(2):pp. 189-198.

Rowley et al., "Alginate hydrogels as synthetic extracellular matrix materials," Biomaterials, Jan. 1999, 20(1): 45-53.

Schmedlen et al., "Photocrosslinkable polyvinyl alcohol hydrogels that can be modified with cell adhesion peptides for use in tissue engineering," Biomaterials, 2002, 23(22):pp. 4325-4332.

Sia et al., "Microfluidic devices fabricated in poly(dimethylsiloxane) for biological studies," Electrophoresis, 2003, 24(21): 3563-3576.

Stachowiak et al., "Bioactive hydrogels with an ordered cellular structure combine interconnected macroporosity and robust mechanical properties," Advanced Materials, 2004, 17(4): 399-403.

Stevens et al., "Direct patterning of mammalian cells onto porous tissue engineering substrates using agarose stamps," Biomaterials, 2005, 26(36): 7636-7641.

Tang et al., "Fabrication of Collagen Gels That Contain Patterned, Micrometer-Scale Cavities," Advanced Materials, Aug. 2004, 16(15): 1345-1348.

Tang et al., "Molding of Three-Dimensional Microstructures of Gels," Journal of the American Chemical Society, 2003, 125(43): 12988-12989.

Tsang et al., "Three-dimensional tissue fabrication," Advanced Drug Delivery Reviews, 2004, 56(11): 1635-1647.

Walker et al., "Microenvironment design considerations for cellular scale studies," Lab on a Chip, 2004, 4(2): 91-97.

Wang et al., "Focal adhesion kinase is involved in mechanosensing during fibroblast migration," Proceedings of the National Academy of Sciences of the United States of America, 2001, 98(20):pp. 11295-11300.

Wang et al., "Substrate flexibility regulates growth and apoptosis of normal but not transformed cells," American Journal of Physiology—Cell Physiology, Nov. 2000, 279:pp. C1345-C1350.

Wong et al., "Directed Movement of Vascular Smooth Muscle Cells on Gradient-Compliant Hydrogels," Langmuir, 2003, 19(5):pp. 1908-1913.

Wozniak et al., "ROCK-generated contractility regulates breast epithelial cell differentiation in response to the physical properties of a three-dimensional collagen matrix," Journal of Cell Biology, Nov. 2003, 163:pp. 583-595.

Wozniak et al., "Use of three-dimensional collagen gels to study mechanotransduction in t47d breast epithelial cells," Biological Procedures Online, 2005, 7(1):pp. 144-161.

Xia et al., "Directional control of cell motility through focal adhesion positioning and spatial control of Rac activation," The Journal of the Federation of American Societies for Experimental Biology, 2008, 22:pp. 1649-1659.

Xia et al., "Soft lithography," Angewandte Chemie International Edition, 1998, 37: 550-575.

Yeh et al., "Micromolding of shape-controlled, harvestable cell-laden hydrogels," Biomaterials, 2006, 27(31): 5391-5398.

Yeung et al., "Effects of substrate stiffness on cell morphology, cytoskeletal structure, and adhesion," Cell Motility and the Cytoskeleton, 2005, 60(1):pp. 24-34.

Zaari et al., "Photopolymerization in Microfluidic Gradient Generators: Microscale Control of Substrate Compliance to Manipulate Cell Response," Advanced Materials, 2004, 16:pp. 2133-2137.

Zaman et al., "Migration of tumor cells in 3D matrices is governed by matrix stiffness along with cell-matrix adhesion and proteolysis," Proceedings of the National Academy of Sciences of the United States of America, Jul. 2006, 103(29):pp. 10889-10894.

Zamir et al., "Mechanical Asymmetry in the Embryonic Chick Heart During Looping," Annals of Biomedical Engineering, 2003, 31(11): pp. 1327-1336.

\* cited by examiner

*FIG. 2A*
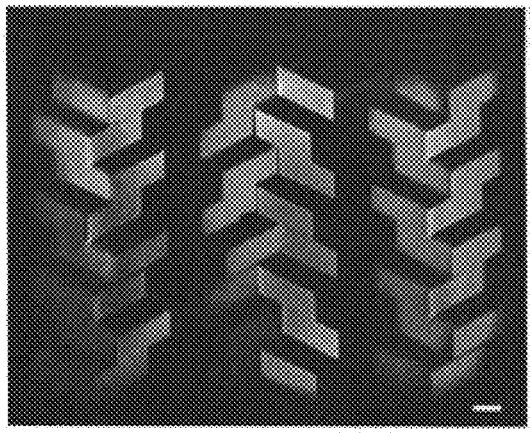 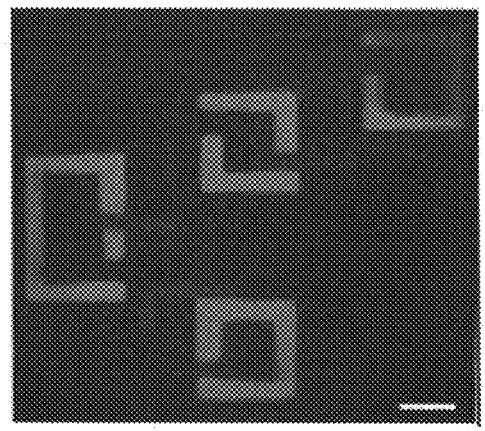
*FIG. 2B*         *FIG. 2C*

FORMING OR PATTERNING COMPOSITE MICROSTRUCTURES USING MICROFLUIDICS

CROSS-REFERENCE TO RELATED APPLICATIONS

This patent application claims the benefit of priority, under 35 U.S.C. Section 119(e), to U.S. Provisional Patent Application Ser. No. 60/921,357, entitled "FORMING OR PATTERNING COMPOSITE MICROSTRUCTURES USING MICROFLUIDICS," filed on Apr. 2, 2007 now expired, which is incorporated herein by reference in its entirety.

STATEMENT REGARDING FEDERALLY-SPONSORED RESEARCH

This invention was made with U.S. government support under Award No. 0747747, awarded by the National Science Foundation (NSF). The U.S. government has certain rights in the invention.

BACKGROUND

This document pertains to, among other thing, fabrication of structures. Certain applications can make use of structures having fine features.

OVERVIEW

Techniques comprising systems and methods for forming or patterning microstructures using microfluidics are described. A target structure can include a microchannel passage with a chamber into which a light hardenable material can be injected and selectively exposed to light to adhere to a desired location of a substrate. Unhardened material can be washed out of the chamber. One or more subsequent cycles can repeat the process using the same or a different material. A variety of composite microstructures can be created, including structures encapsulating viable living cells, such as for cell study or tissue engineering.

Example 1 describes a method. In this example, the method comprises providing a target structure including a passage comprising at least one of an inlet port and an outlet port. The target structure is positioned so as to receive light from a controllable light source. A light-hardenable agent is introduced into the inlet port. A specified region of the passage is exposed to light such that the light-hardenable agent hardens and adheres to a surface of the specified region of the passage.

In Example 2, the method of Example 1 optionally comprises introducing a liquid washing agent into at least one of the inlet port and the outlet port such that an un-hardened portion of the light-hardenable agent is removed from the passage.

In Example 3, the method of any one or more of Examples 1-2 optionally comprises introducing a liquid washing agent into at least one of the inlet port and the outlet port using a syringe.

In Example 4, the method of any one or more of Examples 1-3 optionally is performed such that the acts of introducing a light hardenable agent, exposing a specified region of the passage to light, and washing are performed repeatedly without requiring re-positioning the target structure with respect to the light source.

In Example 5, the method of any one or more of Examples 1-4 optionally comprises serially exposing different specified regions of the passage to light.

In Example 6, the method of one or more of Examples 1-5 optionally comprises providing different light-hardenable agents during different exposures such that the different exposed specified regions of the passage respectively obtain hardened structures having different compositions.

In Example 7, the method of one or more of Examples 1-6 optionally is performed such that providing the target structure includes providing a glass substrate to which the light hardenable agent hardens and adheres.

In Example 8, the method of one or more of Examples 1-7 optionally is performed such that providing the target structure includes providing a polymeric region on the glass, the polymeric region including a channel that, together with the glass, defines the passage.

In Example 9, the method of one or more of Examples 1-8 optionally is performed such that providing a polymeric region includes providing a poly(dimethylsiloxane) (PDMS) region.

In Example 10, the method of one or more of Examples 1-9 optionally comprises treating at least a portion of the glass substrate with an adhesive promoting agent before introducing the light hardenable agent into the inlet port.

In Example 11, the method of one or more of Examples 1-10 optionally comprises treating at least a portion of the glass substrate with an adhesive promoting agent comprising 3-(trimethoxysilyl) propyl methacrylate.

In Example 12, the method of one or more of Examples 1-11 optionally is performed such that providing the target structure comprises providing a glass cover, wherein the PDMS region, the glass cover, and the glass substrate define a chamber capable of receiving light for hardening the light-hardenable agent within the chamber.

In Example 13, the method of one or more of Examples 1-12 optionally is performed such that introducing a light-hardenable agent into the inlet port includes introducing a photopolymerizable agent into the inlet port.

In Example 14, the method of one or more of Examples 1-13 optionally is performed such that introducing a light-hardenable agent into the inlet port includes introducing a photopolymerizable agent into the inlet port, wherein the photopolymerizable agent includes a photoinitiator agent.

In Example 15, the method of one or more of Examples 1-14 optionally comprises using a photoinitiator agent that comprises Irgacure 2959.

In Example 16, the method of one or more of Examples 1-15 optionally is performed such that introducing a light-hardenable agent into the inlet port includes introducing poly (ethylene glycol)-diacrylate (PEG-DA).

In Example 17, the method of one or more of Examples 1-16 optionally is performed such that introducing a light-hardenable agent into the inlet port includes introducing a hydrogel.

In Example 18, the method of one or more of Examples 1-17 optionally is performed such that introducing a light-hardenable agent into the inlet port includes introducing a light hardenable agent that is doped with at least one fluorescent substance.

In Example 19, the method of one or more of Examples 1-18 optionally is performed such that introducing a light-hardenable agent into the inlet port includes introducing an acrylate-based polymer.

In Example 20, the method of one or more of Examples 1-19 optionally is performed such that introducing an acrylate-based polymer includes introducing one or any combination of trimethylolpropane triacrylate (TMP-TA), trimethylolpropane ethoxylate triacrylate (TMpeg-TA), and 1,6-hexanediol diacrylate (HEX-DA).

In Example 21, the method of one or more of Examples 1-20 optionally is performed such that introducing a light hardenable agent into the inlet port includes introducing a substance that hardens to provide a Young's modulus of about 10 kPa.

In Example 22, the method of one or more of Examples 1-21 optionally is performed such that introducing a light hardenable agent into the inlet port includes introducing a substance that hardens to provide a Young's modulus of about 200 kPa.

In Example 23, the method of one or more of Examples 1-22 optionally is performed such that introducing a light hardenable agent into the inlet port includes introducing a light hardenable agent that includes latex microbeads having a diameter of about 5 micrometers.

In Example 24, the method of one or more of Examples 1-23 optionally is performed such that exposing a specified region of the passage to light comprises using a confocal laser scanning microscope.

In Example 25, the method of one or more of Examples 1-24 optionally is performed such that exposing a specified region of the passage to light comprises using a fluorescent microscope.

In Example 26, the method of one or more of Examples 1-25 optionally is performed such that exposing a specified region of the passage to light includes defining a light directing aperture shape to define a shape of the resulting light-hardened agent that adheres to a surface of the specified region of the passage.

In Example 27, the method of one or more of Examples 1-26 optionally is performed such that introducing a light-hardenable agent into the inlet port includes using a syringe to inject the light-hardenable agent into the inlet port.

In Example 28, the method of one or more of Examples 1-27 optionally is performed such that exposing a specified region of the passage to light such that the light-hardenable agent hardens and adheres to a surface of the specified region of the passage to encapsulate a living cell.

In Example 29, the method of one or more of Examples 1-28 optionally is performed such that exposing a specified region of the passage to light such that the light-hardenable agent hardens and adheres to a surface of the specified region of the passage to encapsulate a living cell while preserving a viability of the encapsulated living cell.

In Example 30, the method of one or more of Examples 1-29 optionally is performed such that exposing a specified region of the passage to light such that the light-hardenable agent hardens and adheres to a surface of the specified region of the passage to form at least one of a 3D gear, an engaged pair of 3D gears, 3D parallelogram, a pair of interlinking 3D parallelograms, a 3D chain link, a pair of linked 3D chain links, a 3D disk, and a pair of overlapping 3D disks.

Example 31 describes an apparatus comprising means for providing a target structure including a passage comprising at least one of an inlet port and an outlet port, means for positioning the target structure so as to receive light from a controllable light source, means for introducing a light-hardenable agent into the inlet port, and means for exposing a specified region of the passage to light such that the light-hardenable agent hardens and adheres to a surface of the specified region of the passage.

In Example 32, the apparatus of Example 31 comprises a means for introducing a liquid washing agent into at least one of the inlet port and the outlet port such that an un-hardened portion of the light-hardenable agent is removed from the passage.

In Example 33, the apparatus of one or more of Examples 31-32 comprises means for introducing a light hardenable agent, exposing a specified region of the passage to light, and washing wherein such acts are performed repeatedly without requiring re-positioning the target structure with respect to the light source.

Example 34 describes an apparatus comprising a target structure including a passage comprising at least one of an inlet port and an outlet port, at least a portion of the target structure configured to pass light from a light source into the passage to expose a specified region of the passage to light such that at least a portion of a light-hardenable agent introduced into the passage hardens, the passage including an adhesive region to which the light-hardenable agent adheres when exposed to light.

In Example 35, the apparatus of Example 34 optionally is configured such that the target structure includes a translucent substrate.

In Example 36, the apparatus of one or more of Examples 34-35 is optionally configured such that the target structure includes a glass substrate.

In Example 37, the apparatus of one or more of Examples 34-36 is optionally configured such that the target structure includes a polymeric region located on the glass substrate, the polymeric region and the glass substrate together defining at least a portion of the passage.

In Example 38, the apparatus of one or more of Examples 34-37 is optionally configured such that the target structure further comprises a glass cover.

In Example 39, the apparatus of one or more of Examples 34-38 is optionally configured such that the polymeric region comprises a poly(dimethylsiloxane) (PDMS) region.

In Example 40, the apparatus of one or more of Examples 34-39 is optionally configured such that at least a portion of the glass substrate is treated to promote adhesion of the light-hardenable agent thereto.

In Example 41, the apparatus of one or more of Examples 34-40 is optionally configured such that at least a portion of the glass substrate includes free methacrylate groups on a surface of the portion of the glass substrate that forms an interior of the passage.

In Example 42, the apparatus of one or more of Examples 34-41 is optionally configured such that at least a portion of the glass substrate has been treated with 3-(trimethoxysilyl)propyl methacrylate.

In Example 43, the apparatus of one or more of Examples 34-42 optionally comprises at least one structure adhered to the glass substrate, wherein the at least one structure is formed from the light-hardenable agent.

In Example 44, the apparatus of one or more of Examples 34-43 is optionally configured such that the structure comprises a minimum feature dimension of 3 micrometers.

In Example 45, the apparatus of one or more of Examples 34-44 optionally comprises multiple structures adhered to the glass substrate, wherein at least two of the structures have different material compositions.

In Example 46, the apparatus of one or more of Examples 34-45 optionally is configured such that the structure adhered to the glass substrate includes a hydrogel.

In Example 47, the apparatus of one or more of Examples 34-46 optionally is configured such that the structure adhered to the glass substrate includes a fluorescent substance.

In Example 48, the apparatus of one or more of Examples 34-47 optionally is configured such that the structure adhered to the glass substrate comprises poly(ethylene glycol)-diacrylate (PEG-DA).

In Example 49, the apparatus of one or more of Examples 34-48 optionally is configured such that the structure adhered to the glass substrate comprises one or any combination of trimethylolpropane triacrylate (TMP-TA), trimethylolpropane ethoxylate triacrylate (TMpeg-TA), and 1,6-hexanediol diacrylate (HEX-DA).

In Example 50, the apparatus of one or more of Examples 34-49 is optionally configured such that the structure adhered to the glass substrate comprises a Young's modulus of about 10 kPa.

In Example 51, the apparatus of one or more of Examples 34-50 is optionally configured such that the structure adhered to the glass substrate comprises a Young's modulus of about 200 kPa.

In Example 52, the apparatus of one or more of Examples 34-51 is optionally configured such that the structure adhered to the glass substrate comprises latex microbeads having a diameter of about 5 micrometers.

In Example 53, the apparatus of one or more of Examples 34-52 is optionally configured such that the structure adhered to the glass substrate comprises an encapsulated viable living cell.

In Example 54, the apparatus of one or more of Examples 34-53 is optionally configured such that the structure adhered to the glass substrate comprises at least one of a 3D gear, an engaged pair of 3D gears, 3D parallelogram, a pair of interlinking 3D parallelograms, a 3D chain link, a pair of linked 3D chain links, a 3D disk, and a pair of overlapping 3D disks.

In Example 55, the apparatus of one or more of Examples 34-54 optionally comprises a confocal laser scanning microscope configured to deliver light to the passage of the target structure.

In Example 56, the apparatus of one or more of Examples 34-55 optionally comprises a fluorescent microscope configured to deliver light to the passage of the target structure.

In Example 57, the apparatus of one or more of Examples 34-56 optionally comprises an aperture configured to define a shape of a light-hardened agent that adheres to a surface of the specified region of the passage.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIGS. 2A, 2B, and 2C illustrate examples of fabrication of 3D composite microstructures that can be of different geometries, sizes, and spatial resolution.

DETAILED DESCRIPTION

Figure 1A:
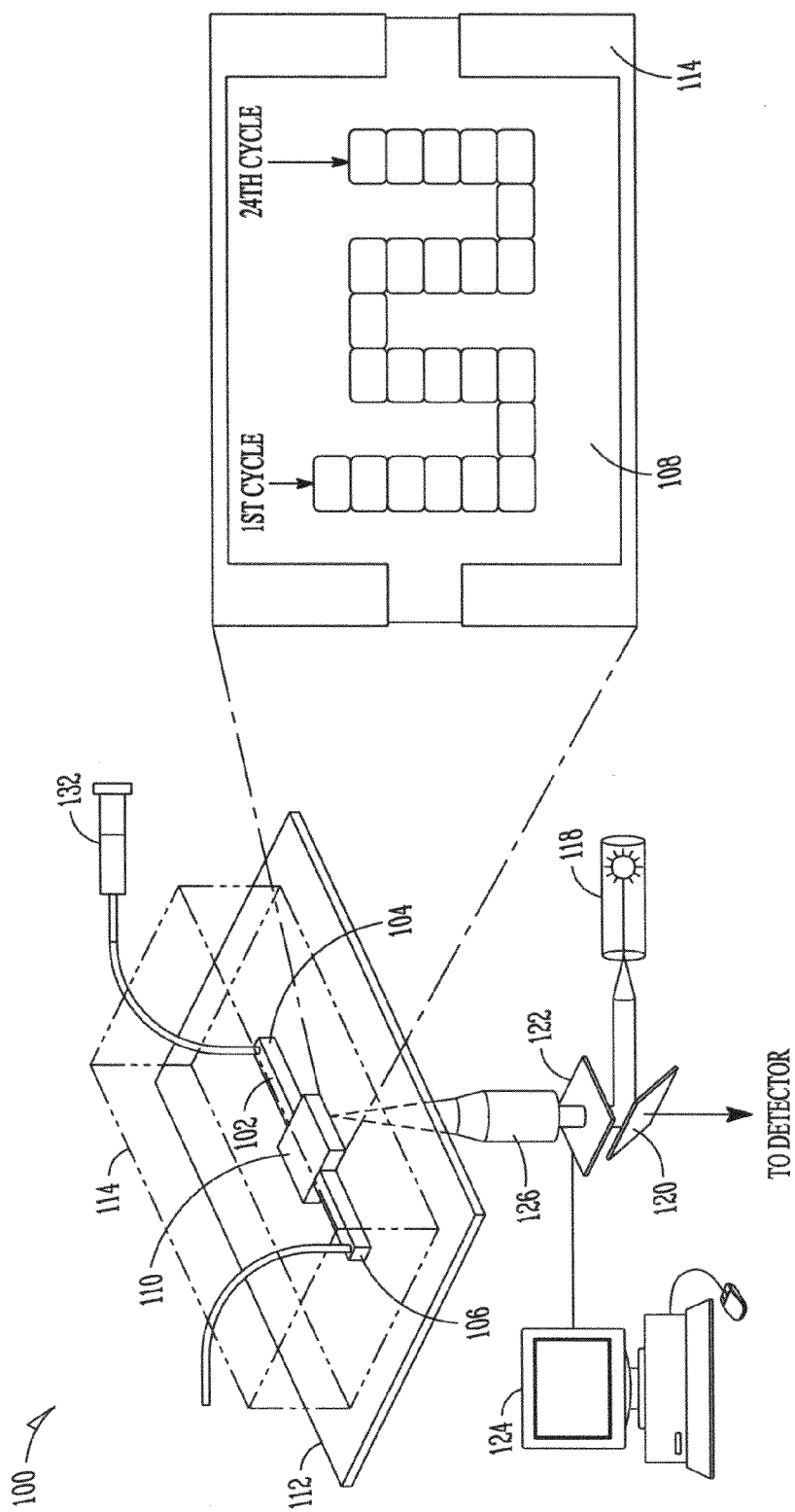
FIG. 1A is a schematic diagram showing an example of an apparatus 10 that can be used to form or pattern a microstructure, such as by using microfluidics.

This document describes, among other things, techniques that can include versatile and fast systems and methods for patterning three-dimensional (3D) monolithic microstructures. In certain examples, such a microstructure can be made of one or multiple (up to 24 demonstrated experimentally but, in principle, infinite) different types of materials. Regions of the same or different materials can all be spatially aligned or positioned, such as inside a microchannel. In certain examples, these techniques can use confocal scanning or fluorescence microscopy to polymerize selected regions of a photocurable material. Microfluidics can also be used, in certain examples, such as to automate a delivery of one or a series of washes or photocurable reagents. Upon completion of a desired number of fabrication cycles, spatially aligned 3D microstructures can be suitable for microfluidic manipulation and analysis.

We can experimentally demonstrate an example of fabrication of composite 3D microstructures with various useful interesting geometries, size scales (e.g., up to 1 mm$^2$), spatial resolution (e.g., down to 3 μm), and materials. For a typical multi-cycle example of our process, the total fabrication time can be only tens of minutes, as compared to tens of hours for other approaches involving manual and time-consuming steps for alignment, exposure, and baking between photolithographic cycles to produce appropriately aligned composite structures. In a particular example, such as in the case of using one or more 3D hydrogels, a potential use can be the direct patterning of homogeneous or even inhomogeneous 3D microenvironments, such as for tissue engineering or for studying cell behavior.

Examples of some potential advantages of some of the present techniques can include, without limitation, one or more of: (1) a microstructure that can adhere to the microfluidic channel, instead of being carried away by the wash; (2) compatibility with either a mask or maskless system, since masks are not required; (3) an anisotropic microstructure can be obtained, such as by sequentially introducing and polymerizing different materials in the microstructure; and (4) a biocompatible microstructure is possible.

Monolithic microstructures made of a single type of material (such as silicon, photoresist, or PDMS) are useful for developing microfabricated systems such as for materials science and biology. Mask-based or direct-write photolithography approaches can be used for fabricating such microstructures.

The present inventors have recognized that composite 3D microstructures, which can be made of multiple different types of materials, if desired, can be useful for a variety of applications. Examples of such applications can include, without limitation, one or more of nanoparticle composite materials, photonic devices, microelectromechanical systems, or cell biology (e.g., to mimic a native extracellular environment). Spatial control over composite microstructures of regular patterns can be achieved, such as by templating or self-assembly approaches. For arbitrary patterns, a top-down microfabrication approach can require manual and time-consuming steps (e.g., over 1 hour for alignment, exposure, and baking steps) between lithographic cycles to produce correctly aligned composite structures.

The present inventors have recognized that microfluidics can offer a convenient and powerful way to deliver like or different photocurable materials, such as for making one or more composite 3D microstructures. Microfluidics can also allow for efficient washing, and can use a small amounts of one or more reagents. During a particular lithographic cycle, we can fabricate a microstructure that can adhere to a surface of the channel, and wash away the unpolymerized pre-polymer. Since the sample need not be removed from the stage between lithographic fabrication cycles, time-consuming steps of alignment and re-registration can be circumvented. Direct-write lithography (e.g., without microfluidics) can be used for patterning of two different molecules on a surface. Microfluidics can be combined with lithography, such as to synthesize structures made of one or more different types of material. Using microfluidics in multi-step lithography can potentially achieve the fabrication and patterning of 3D microstructures that can make use of many different materials (if desired) in a timely and automated fashion. This can reduce or eliminate the need for using expensive specialized equipment that would otherwise be used in an industrial setting.

Example of Apparatus

FIG. 1A is a schematic diagram showing an example of an apparatus 10 that can be used to form or pattern a microstructure, such as by using microfluidics. In this example, a target structure 100 can include a microchannel or other passage 102. The passage 102 can include an inlet port 104, an outlet port 106, and a chamber 108 located between the inlet port 104 and the outlet port 106. In certain examples, the desired microstructure can be formed in the chamber 108. By way of example, but not by way of limitation, the chamber 108 can include a rectangular box (e.g., 5 millimeters wide by 5 millimeters long by 165 millimeters tall), with the inlet port 104 and the outlet port 106 allowing passage of one or more materials to or from the chamber 108.

In certain examples, the target structure 100 can be formed from a top layer 110, an intermediate layer 112, and a bottom layer 114. In certain examples, the passage 102 can pass through the intermediate layer 112. In certain examples, the passage 102 can include sides defined by the intermediate layer 112, a top defined by the top layer 110, and a bottom defined by the bottom layer 114. In an illustrative example, the top layer 110 and bottom layer 114 can be formed using glass, and the intermediate layer 112 can be formed using poly(dimethylsiloxane) (PDMS). This or a similar configuration can be used to limit the influx of oxygen, which can inhibit radical-induced photopolymerization in forming the microstructure within the chamber 108.

In certain examples, one (or optionally both) of the top layer 110 or the bottom layer 114 can be treated, such as to promote adhesion of the microstructure to the desired one (or both) of the top layer 110 or the bottom layer 114. In an illustrative example, such as in which an acrylate-based hydrogel is to be used to form the microstructure, one or both of the top-layer 110 can be treated with 3-(trimethoxysilyl)propyl methacrylate, such as to promote adhesion of the polymerized microstructure. This can include pre-treating or otherwise treating one or both of the top layer 110 or the bottom layer 114, such as before assembly with the intermediate layer 112.

The target structure 100 can be positioned so as to be able to receive light from a controllable light source 116. In certain examples, the controllable light source 116 can include a confocal laser scanning microscope (e.g., Zeiss LSM 510 META) or a fluorescent microscope (e.g., Leica CTR 6000 inverted fluorescent microscope). In certain examples, the target structure 100 can be placed on a stage, such as an automated motorized or other controllably positionable stage. Thus, in certain examples, the target structure 100 can either be moved with respect to the controllable light source, or light from the controllable light source 116 can be controllably directed toward a specified portion of the target structure 100, or both. Either one or both of the top layer 110 and bottom layer 114 can be made substantially transparent to the light received from the light source 116, such as to allow light-induced hardening of a substance in the chamber 108 to form the microstructure.

The example of FIG. 1A illustrates a setup using a confocal laser scanning microscope as the controllable light source 116. This example includes a laser 118 that can be directed at a dichroic mirror 120, and then toward an x-y scanning mirror 122 that can be controlled by the computer 124. The laser light from the x-y scanning mirror 122 can be controllably directed at a desired location of the target structure 100, such as through a microscope objective lens 126.

A fluid substance can be delivered to the inlet port 104, or from the outlet port 106, such as via an inlet tube 128 or an outlet tube 130, which can be attached respectively thereto. In an illustrative example, a needle syringe 132 can be attached to the inlet tube 128, such as to deliver material thereto.

Example of Technique of Forming a Microstructure

Figure 1B:
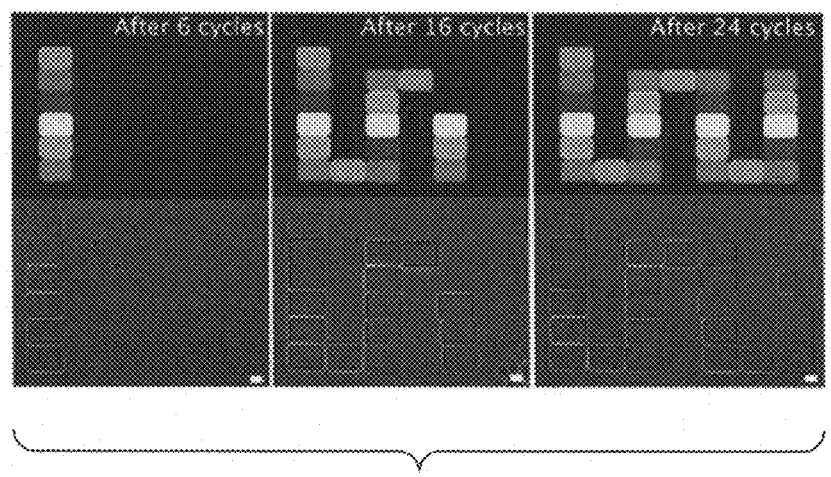
FIG. 1B illustrates an example of a 3D microstructure made from 24-cycle fabrication.
Figure 1C:
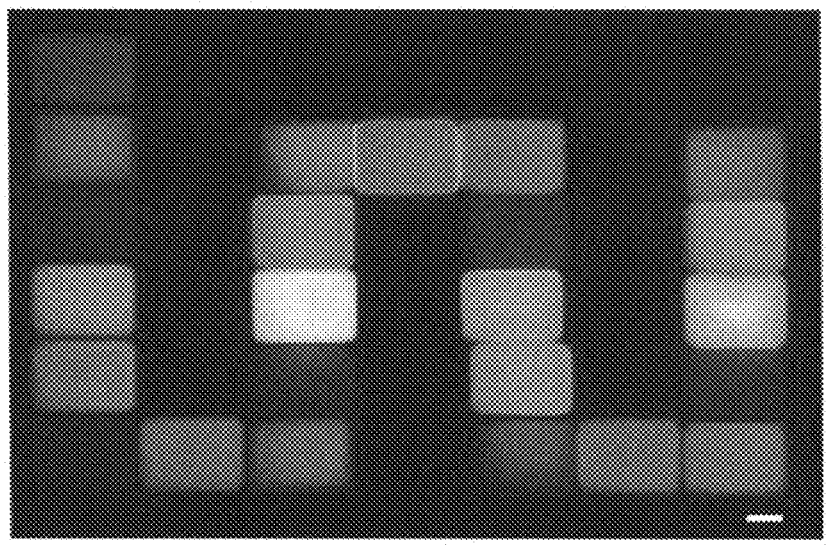
FIG. 1C is an example of a merged fluorescence image (e.g., red, green, and blue channels) of a final 3D composite microstructure after 24 cycles of fabrication (in FIG. 1C, all scale bars=200 μm).
Figure 1D:
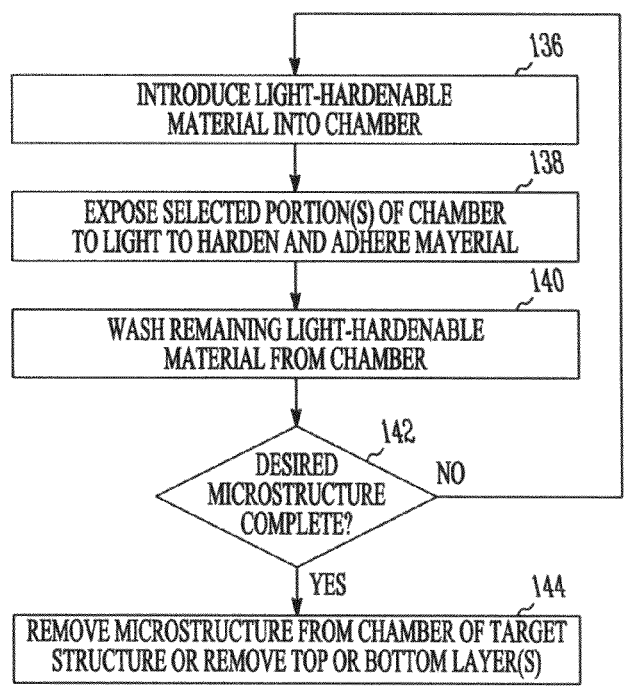
FIG. 1D shows an example of a technique of using an apparatus, such as that shown in FIG. 1A, to fabricate a desired microstructure.

FIG. 1D shows an example of a technique of using an apparatus, such as that shown in FIG. 1A, to fabricate a desired microstructure. In this example, at 136, a light-hardenable material is introduced into the chamber 108 of the target structure 100, such as by using the syringe 132 to inject a flowable substance into the chamber 108 via the inlet port 104.

At 138, one or more selected portions of the chamber 108 are serially or concurrently exposed to light, such as to at least partially harden and adhere the flowable substance to the one or more selected portions of the chamber 108. In certain examples, this includes adhering to a desired one of the top layer 110 or the bottom layer 114, such as by pre-treating the desired one of the top layer 110 or the bottom layer 114, such as to promote such adhesion thereto. In certain examples, this can include adhering to both of the top layer 110 and the bottom layer 114, such as by pre-treating both of the top layer 110 and the bottom layer 114 to promote such adhesion thereto.

At 140, following the light-exposure of 138, remaining (e.g., non-exposed) light-hardenable material in the chamber 108 can optionally be washed from the chamber 108, such as by introducing a flowable substance into the chamber 108 to perform such washing of non-exposed light-hardenable material out of the chamber 108 via the outlet port 106. The washing at 140 can be particularly useful in forming a composite microstructure made of different materials, such as by then introducing a different light-hardenable material into the chamber 108 for selective exposure to light during a later cycle of formation of the composite microstructure.

At 142, if the desired microstructure is not yet complete, then the process returns to 136 to begin a new cycle, in which the same or a different light-hardenable material can be introduced into the chamber 108, as desired. Otherwise, if the desired microstructure at 142 is complete, then the process can optionally continue to 144, in which the adhered microstructure can be optionally separated from the chamber 108. Removing the adhered microstructure can include separating one or both of the top layer 110 or the bottom layer 114 from the intermediate layer 112, such as by peeling, prying, or otherwise applying a mechanical force. Then, the microstructure can be removed from the chamber 108, such as by washing the microstructure until it swells or otherwise lifts off or detaches. If it is desired to leave the microstructure adhered to one of the top layer 110 or the bottom layer 114, then one or both of the top layer 110 or the bottom layer 114 can be removed from the intermediate layer 112 without then removing the microstructure from the one of the top layer 110 or the bottom layer 114 to which the microstructure is adhered.

Results and Discussion of an Illustrative Example

In an illustrative example, an experimental prototype was constructed and tested. In such an example, the target structure 100 can be placed on a stage of an inverted fluorescence microscope. In certain examples, we can demonstrate the patterning of monolithic 3D structures such as a structure made of poly(ethylene glycol)-diacrylate (PEG-DA). PEG-DA is a photopolymerizable material. In certain examples, PEG-DA can advantageously be used for encapsulating living cells, such as for study, for creating an engineered tissue, or for another purpose. PEG-DA can exhibit a sufficiently low viscosity (e.g., <35 cP) to allow for reasonable flow rates (e.g., 1 mL min$^{-1}$), such as within the passage 102 when using a syringe 132 to inject.

After scanning a desired region, such as to expose the desired region to light to photopolymerize and adhere the PEG-DA in the desired region, we can wash away unpolymerized material. Then, we can inject the same or a different photocurable material (if desired) for a subsequent cycle. The height of the microstructure can be determined by the height of the chamber 108 when the depth of field of the objective lens 126 is comparable to the height of the chamber 108. To help attain reliable or fast fabrication, in certain examples, it can be desirable to use one or more of the following parameters: (1) Flow rate of less than 1.5 mL min$^{-1}$ for at least 1 mL of washing solution, such as for permitting sufficient washing of unpolymerized pre-polymer without shearing off the polymerized structures; (2) High concentration of a photoinitiator, such as to reduce or minimize polymerization time, decrease diffusion of radicals, or increase the spatial fidelity and resolution; or (3) correct focusing by the objective lens 126 of light within the chamber 108, which in certain examples can be facilitated by introducing a fluorescent dye into the chamber 108 before the fabrication. Factors that can tend to increase the total time of fabrication can include one or more of: low percentage of photopolymerizable gel (which can increase the light exposure time), large scanning area being exposed to light, and a large number of cycles, such as illustrated in the example of FIG. 1D.

Using such a setup as illustrated in the example of FIG. 1A, we can demonstrate fabrication of a 3D microstructure, with high spatial control, made of 24 cycles of materials in 45 minutes, such as shown in the examples of FIGS. 1B and 1C. FIG. 1B illustrates an example of a 3D microstructure made from 24-cycle fabrication. A microfluidic target structure 100 can be placed onto the stage of an inverted fluorescence microscope (or, as shown in FIG. 1A, the stage of a confocal microscope; for an epifluorescence microscope, an automated x-y stage can be used instead of an x-y scanning mirror). Photocurable reagents or washes (e.g., with phosphate buffered saline (PBS) or ethanol) can be delivered into the chamber 108, such as by using a syringe 132 for injection into the inlet port 104. Each "lithographic cycle" can include selective light exposure (e.g., 1 to 2 seconds), washing of unpolymerized pre-polymer (e.g., 1 min), injection of pre-polymer flowable material for the next cycle (e.g., 12 seconds), and microscope illumination area positioning or alignment (e.g., less than 1 minute, including the time generally needed for manual fine adjustment for a conventional fluorescence microscope).

During each lithographic cycle, the same microscope, under brightfield mode, can be used to visualize the spatial fidelity of the fabrication, or of a desired portion thereof. FIG. 1B illustrates an example of schematic patterns and corresponding brightfield images of experimental microstructures that were fabricated after 6, 16, and 24 cycles. In these examples, the respective total fabrication times were 12, 30, and 45 minutes. The polymerized microstructures can be visualized during each lithographic cycle, if desired. They exhibited a change of index of refraction, in this example. The wide-spectrum light was not sufficiently intense at the excitation wavelength to polymerize the unpolymerized pre-polymer. In certain examples, the pre-polymer can include 40% weight/volume of PEG-DA, with 2% weight/volume of Irgacure 2959 as a photoinitiator. For clarity of visualization, the PEG-DA (or other unpolymerized prepolymer) in each cycle can be doped with a desired one or a combination of fluorescent dyes, such as: fluorescein (green), rhodamine B (red), or 7-(diethylamino) coumarin-3-carboxylic acid (blue) (see Table I). FIG. 1C is an example of a merged fluorescence image (e.g., red, green, and blue channels) of a final 3D composite microstructure after 24 cycles of fabrication (in FIG. 1C, all scale bars=200 µm).

During the verification of the x-y spatial fidelity by brightfield microscopy, as shown in the example of FIG. 1B, we can observe high spatial fidelity and fast fabrication over all cycles, with no deterioration in the 24th cycle compared to the 1st cycle. (For fabrication beyond 24 cycles, the total time of fabrication would scale linearly with the number of cycles.) For hydrogels, some diffusion of fluorescent molecules can occur between materials fabricated during different cycles, as shown in FIG. 1C.

Figure 5A:
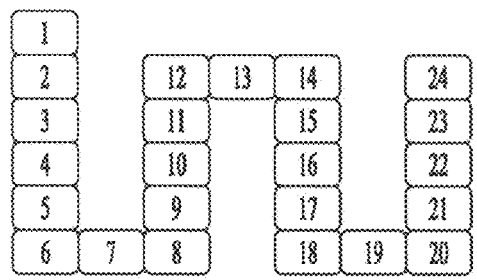
FIGS. 5A-5G provide schematic representations of composite structure patterns for FIGS. 1A-1C, 2A-2C, 3A-3C, and 4.
Figure 5B:
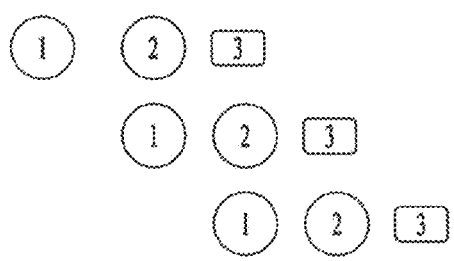
Figure 5C:
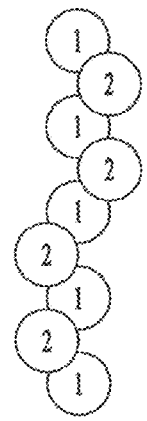
Figure 5D:
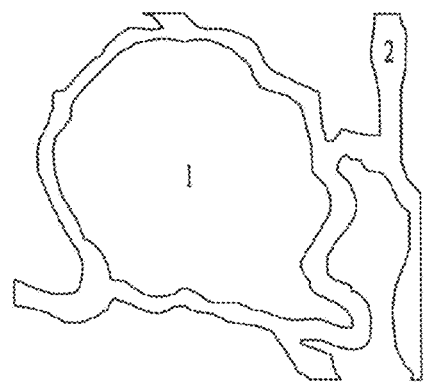
Figure 5E:
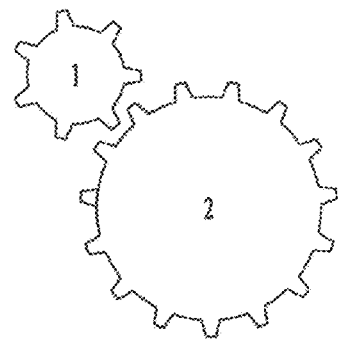
Figure 5F:
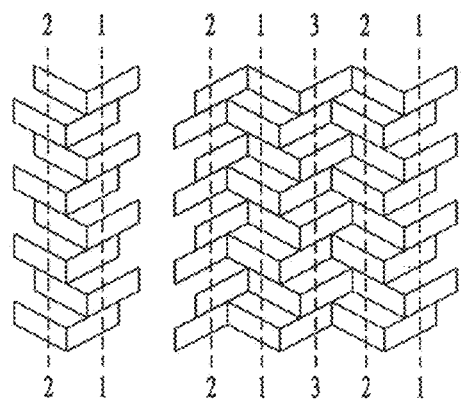
Figure 5G:
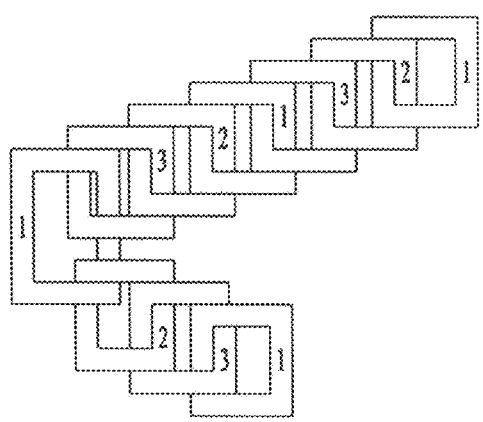

We can fabricate a variety of composite 3D microstructures of various interlinking patterns and spatial resolution, such as by using a confocal microscope. Confocal microscopy offers highly calibrated spatial positioning by region-of-interest scanning. First, we can demonstrate fabrication (e.g., via two cycles) of an interlinking set of gears, and can verify the intended three-dimensionality of the microstructures by confocal microscopy followed by 3D reconstruction, such as shown in the example of FIG. 5E. We can also demonstrate fabrication (e.g., via three cycles) of an array of closely interlinking parallelogram structures, such as shown in the example of FIG. 5F. For the example of FIG. 5F, in which the surface area (1 mm$^2$) was large by microfabrication standards, the total fabrication time can be only 24 minutes. In a third pattern, we can demonstrate fabrication (e.g., via three cycles) a chain-like pattern, such as shown in the example of FIG. 5G. Overall, using the confocal microscope, we can achieve a spatial resolution of less than 3 µm, which is slightly larger than the predicted resolution of 2 µm from the focal volume. Without being bound by theory, we believe this difference could be due to light scattering, or possibly a slight residual flow of the pre-polymer during the light exposure (which generally can be on the order of seconds).

Figure 3A:
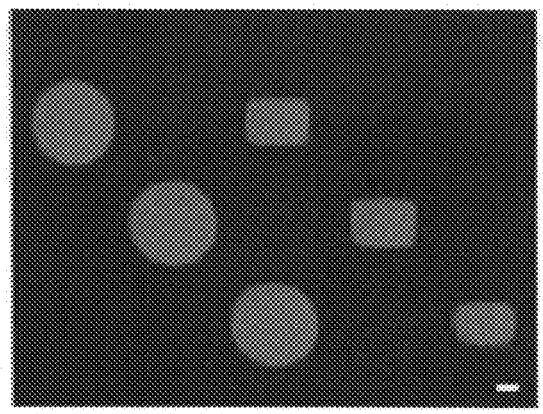
FIGS. 3A, 3B, and 3C illustrate examples of fabrication and characterization of microstructures made of materials with different chemical and bead compositions.

We can also demonstrate fabrication of one or more composite microstructures made of one or more materials, other than PEG-DA, which can similarly be doped with fluorescent molecules, if desired. First, using a epifluorescence microscope, we can demonstrate fabrication of one or more microstructures made from one or more of at least three other acrylate-based polymers: trimethylolpropane triacrylate (TMP-TA), trimethylolpropane ethoxylate triacrylate (TMpeg-TA), or 1,6-hexanediol diacrylate (HEX-DA). This range of different materials can allow for the fabrication, e.g., within the same microstructure, of islands with different chemical compositions, porosities, or stiffnesses. For example, we can measure the Young's moduli of these materials (under the experimental conditions of this study) to range from 10 kPa (e.g., comparable to that of adipose or muscle tissue) to 200 kPa (comparable to that of cartilage). We can demonstrate fabrication (e.g., via 3 cycles) of aligned 3D monolithic microstructures made of TMP-TA, TMpeg-TA, and HEX-DA, such as shown in the example of FIG. 3A. We can also demonstrate fabrication of a composite microstructure made of two sets of overlapping PEG-DA disks in an alternating geometry, with one set of the disks doped with 5 µm-diameter latex microbeads. These microbeads, which can be expected to be visible along the sides of the 3D structures, permit further investigation of the spatial fidelity of the fabrication, such as by using scanning electron microscopy (SEM). SEM images can be collected at different magnifications to show clean edges with vertical sidewalls (FIGS. 3B, 3C), with the particular configuration of disks with and without the microbeads (FIG. 3C).

Figure 4:
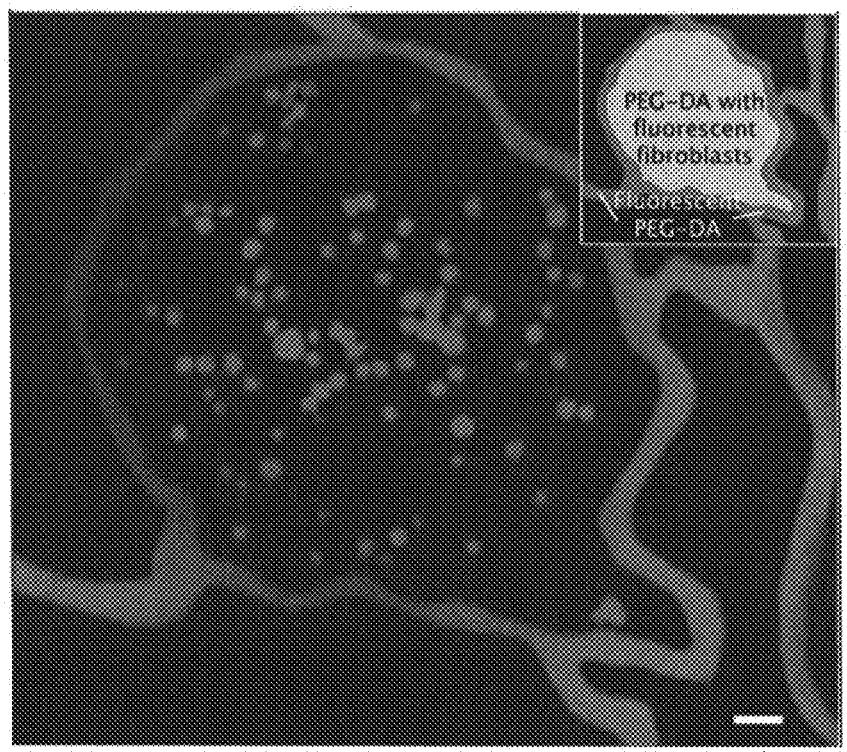
FIG. 4 illustrates an example of fluorescence image of mammalian cells inside an example of a 3D composite microstructure.
Figure 6:
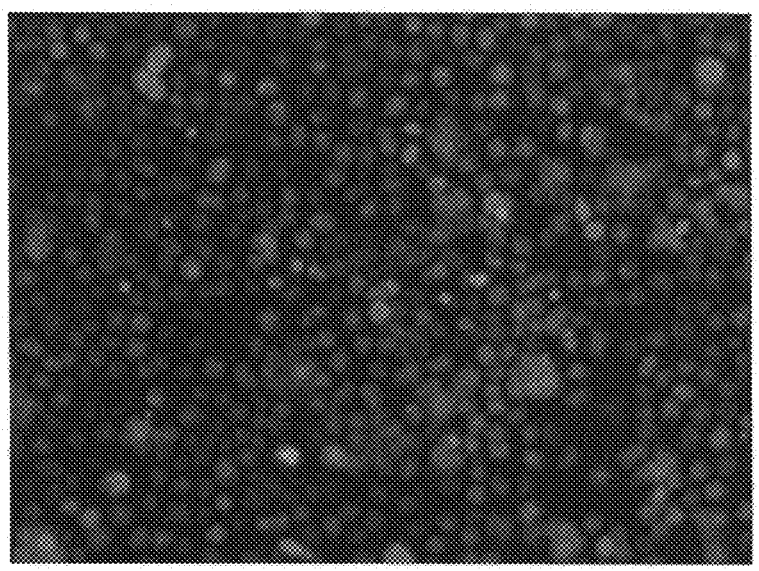
FIG. 6 shows an example of 3T3 fibroblasts encapsulated in PEG-DA with LIVE/DEAD cytotoxicity assay stain.

The present inventors have also recognized, among other things, that the ability to spatially pattern islands of different material properties can be useful in certain examples for replicating the anisotropy and inhomogeneity of biological 3D microenvironments, which can play an important role in the behavior of living cells. We can first demonstrate the viability of living cells, such as 3T3 fibroblasts, in a PEG-DA microstructure that has been polymerized by long wavelength-UV light. PEG-DA can be used to encapsulate one or more living cells in a 3D microenvironments, and it can be chemically coupled with adhesion, or with arginine or one or more peptides. (e.g., Using a LIVE/DEAD assay, we can observe a viability of over 95% of such encapsulated cells after photopolymerization, such as shown in the example of FIG. 6. We can fabricate a 3D composite microstructure of PEG-DA encapsulating fibroblasts. The fibroblasts can be encapsulated within a network of acellular hydrogel, such as shown in the example of FIG. 4, such as in a geometry or size scale that mimics those of a tissue. The final patterned 3D composite microstructures can be accessed, such as by peeling away or otherwise removing the PDMS (e.g., for microscale tissue engineering), or can be left inside the chamber 108 of the microchannel passage 102, such as for further microfluidic interrogation or analysis. The feasibility of studying cell-to-cell communication in the 3D environments of such a microstructure-based system is supported by the fact that we can observe diffusion of small molecules (e.g., fluorophores) between microstructure materials made during different fabrication cycles.

Fabrication challenges can potentially include: 1) Difficulty of fabricating thick structures (e.g., greater than hundreds of micrometers) with high spatial fidelity, for example, due to light scattering; 2) Potentially long total time of fabrication for large structures (e.g., several mm) of many different types of materials (e.g., hundreds), for serial rather than parallel fabrication; 3) Limitations in choice of materials, which should typically share compatible sets of solvents (e.g., to avoid swelling and collapsing of polymerized structures), and should typically exhibit sufficiently low viscosity (e.g., less than tens of cP) for reliable microfluidic flow.

Overall, we can demonstrate a versatile technique that can use microfluidics and fluorescence microscopy, such as to fabricate aligned, composite 3D microstructures that can be made of a large number of different materials more quickly than other fabrication techniques (e.g., tens of minutes rather than tens of hours for 24 materials). In certain applications, biocompatibility of the acrylate-based hydrogels and the spatial resolution obtainable (e.g., below 3 □m) are potentially useful for tissue engineering or for studying cell behavior, such as in inhomogeneous and anisotropic 3D environments that can mimic the complexity of biological microenvironments.

Example of Forming a Target Structure

A microfluidic target structure 100 that includes a PDMS intermediate layer 112 can permit a photopolymerizable microstructure to be fabricated, washed, and examined under a microscope without needing to remove the microstructure sample or the target structure 100 from a stage upon which the target structure 100 is placed. This can avoid any need for repositioning and re-focusing the sample or the target structure 100 between cycles of infusion of the same or different types of photocurable materials into the chamber 108.

In an illustrative example, an experimental prototype of the target structure 100 was constructed. The chamber 108 can be a generally square-shaped well (e.g., 5 millimeters×5 millimeters×165 millimeters) with an inlet port 104 and an outlet port 106 to allow passage of materials, such as shown in the example of FIG. 1A. In an illustrative example, assembly of the experimental prototype device were performed as follows. First, we designed a transparency mask, which can include the channel features of the intermediate layer 112, in CleWin (WieWeb Software, the Netherlands), and printed it at CADArt Services, Inc. (Bandon, Oreg.). Then, using photolithography, we can fabricate a silicon master with square shape protrusions defining the chamber 108 (e.g., 5 mm×5 mm×165 mm), a microchannel passage 102 providing an inlet port 104 and an outlet port 106. A PDMS base and curing agent can be mixed (e.g., in the ratio of 10:1), degassed, and cured on the silicon master, such as at 60° C. for two hours. The cured PDMS intermediate layer 112 channel mold can be cut out. A piece of number 1 or 0 cover glass (e.g., 4 mm×4 mm) can be bonded or otherwise adhered to the top of the square chamber 108 of the intermediate layer 112, such as by first plasma-treating one or both components in a plasma oxidizing apparatus (e.g., at high power for 2.5 minutes), and then bonding the two components together, such as to incorporate one of the top layer 110 or the bottom layer 114. Then, this assembly can be similarly permanently or otherwise bonded to another piece of larger number 1 cover glass (24× 40 cm$^2$), such as by, such as to incorporate the other one of the top layer 110 or the bottom layer 114. Two pieces of 0.38 millimeter (inner diameter) polyethylene tubing (e.g., from Intramedic) can be respectively inserted or otherwise communicatively coupled to the inlet port 104 and outlet port 106. A needle syringe 132 can be connected to the inlet port 104, such as to deliver a solution or other flowable substance into the microchannel passage 102 via the inlet port 104.

To promote adhesion of the fabricated microstructure onto the substrate, we can soak or incubate the desired portion of the chamber 108 with 3-(trimethoxysilyl) propyl methacrylate (TMSM), such as for 15 minutes at room temperature or an elevated temperature. This can be followed by one or several washes with 100% ethanol, after which the assembly can be heated, such as on a hot plate at 110° C. for another 15 minutes. This leaves free methacrylate groups on the glass surface, which can then link covalently to an acrylate-based polymer upon polymerization. Where removal of the PDMS chamber after polymer microstructure fabrication is desired, we can omit or modify the plasma treatment of PDMS, such as to prevent permanent bonding to the underlying glass. Also, in certain examples, only the glass bottom layer 114 of the chamber 108 can be treated with 3-(trimethoxysilyl) propyl methacrylate, so that the fabricated microstructures can preferentially stick to the glass bottom layer 114 substrate but not to the glass top layer 110 at the top of the chamber 108.

To achieve partial adhesion, one can soak the glass in 1 w/v % TMSM in 70% ethanol for an hour, rinse with 100% ethanol, and bake for 15 minutes. This can be followed by one or several washes to promote swelling (PEG-DA hydrogel swells significantly at low polymer density) and lift-off to detach the microstructure from the substrate onto which it is adhered.

Example of Materials

Poly(ethylene glycol)-diacrylate (PEG-DA, Mn 400), 1,6-Hexanediol diacrylate (HEX-DA), and Polybead® Microspheres (0.50 μm) can be purchased from Polysciences (Warrington, Pa.). Trimethylolpropane Triacrylate (TMPTA), Trimethylolpropane Ethoxylate Triacrylate (TMpegTA), Triethanolamine, 3-(trimethoxysilyl) propyl methacrylate, 1-vinyl-2-pyrrolidone (NVP), Rhodamine B, Fluorescein, Hoechst 33342, Eosin Y, and TRIZMA® acetate can be purchased from Sigma (Milwaukee, Wis.). Swiss 3T3-L1 fibroblasts (CL-173) and Dulbecco's Modified Eagle's Medium (DMEM) can be purchased from American Type Culture Collection (Manassas, Va.). Other cell culture and cell staining reagents can purchased from Invitrogen (Carlsbad, Calif.). Polydimethylsiloxane (PDMS) can be purchased from Dow Corning (Midland, Mich.). A high intensity UV lamp (Model B-100A) can be purchased from UVP, Inc. (Upland, Calif.). All reagents can be used without further purification.

Example of Cell Culture

Fibroblasts can be passaged under 5% $CO_2$ at 37° C. in DMEM that can be adjusted to 4 mM L-glutamine, 1.5 g/L sodium bicarbonate, 4.5 g/L glucose, supplemented with 10% bovine calf serum and 1% penicillin/streptomycin, and used at 80% confluence, in certain examples. To fluorescently label the cells, 2 mL of pre-warmed 5 mM CellTracker CMRA dye (Orange) can be added to a culture flask and incubated, such as for 30 minutes. The dye solution can be replaced with fresh, pre-warmed medium and the cells can be incubated, such as for another 30 minutes. The medium can be discarded and the cells can be rinsed a few times with PBS. Fluorescently labeled cells can be trypsinized and re-suspended in fresh medium.

Example of Preparation of Pre-Polymer

To demonstrate the composite microstructure fabrication capability of our system, we can demonstrate use of multiple acrylate-based polymers along with, in certain examples, different combinations of fluorescent dyes or beads to fabricate the microstructures. FIGS. 5A-5G and Table 1 describe examples of patterns and compositions for each cycle. The pre-polymers can be prepared and shielded from light until use. FIGS. 5A-5G provide schematic representations of composite structure patterns for FIGS. 1A-1C, 2A-2C, 3A-3C, and 4. The numbers within each panel of FIGS. 5A-5G indicate the cycle number for a particular structure. The top left (FIG. 5A) and top middle (FIG. 5B) panels represent patterns that can be created using a widefield fluorescence microscope and the top right (FIG. 5C) and bottom (FIGS. 5D, 5E, and 5F) panels represent patterns that can be created using a confocal microscope.

Example of Fabrication by Confocal Laser Scanning Microscope

In an illustrative example, the confocal laser scanning microscope that can be used to pattern microstructures, such as shown in FIG. 2 and FIG. 4, can be a Zeiss LSM 510 META. Briefly, a pre-defined pattern can be drawn as a region-of-interest in the LSM 5 software. In certain examples, upon introducing pre-polymer solution into the microfluidic chamber 108, a 514 nm argon laser beam (6.25 mW average power output) can be focused within the chamber 108 and scanned through the region-of-interest, such as at 3.2-12.8 μs/pixel, and the scanning can be repeated for 10-15 times. Using a 10×0.5 numerical aperture (NA) objective lens, a scanning resolution that can be used is 512×512 pixels, which can span an area close to 1×1 $mm^2$. Resulting polymerized structures can be observed through the eye-piece under transmitted bright field. The chamber 108 can be flushed with one or more washes (e.g., PBS) and then a new (same or different) pre-polymer can be introduced for the next cycle of fabrication. The final composite microstrucure can be imaged directly from the confocal microscope or fluorescent microscope, such as through the bottom glass 114 of the microfluidic chamber 108.

FIGS. 2A, 2B, and 2C illustrate examples of fabrication of 3D composite microstructures that can be of different geometries, sizes, and spatial resolution. In this example, the microstructures can comprise 40% w/v PEG-DA, with 200 mM Eosin Y as photoinitiator, polymerized using an argon laser on a confocal laser scanning microscope. FIG. 2A shows an example of three dimension-reconstructed images from confocal microscopy of an example of a 3D gear design fabricated from PEG-DA prepolymer doped with fluorescein (e.g., green) and rhodamine B (e.g., red). Total fabrication time can be 9 minutes in this example. FIG. 2B shows an example of a merged fluorescence image (e.g., red, blue, and green channels) of an example of a 12 by 8 array of parallelograms, such as can be fabricated via 3 lithographic cycles, over a large surface area (e.g., 1 $mm^2$). Total fabrication time can be 24 minutes in this example. FIG. 2C shows an example of a merged fluorescence image (e.g., pseudo colored in blue, purple, and magenta for PEG-DA doped with rhodamine B, 7-(diethylamino) coumarin-3-carboxylic acid, and fluorescein, respectively) of a chain-like pattern of microstructures, which can be fabricated via three cycles. Total fabrication time can be 15 minutes in this example. For these examples, schematic diagrams of designed exposure patterns for all cycles are provided in FIGS. 5E, 5F, and 5G. In the examples of FIGS. 2A, 2B, and 2C, all scale bars=50 μm.

Example of Fabrication by Fluorescent Microscope

In an illustrative example, a fluorescent microscope can be used to fabricate one or more microstructures. In an experimental study, we can use a Leica CTR 6000 inverted fluorescent microscope (Leica Microsystems, IL) equipped with an automated motorized-stage and InVitro acquisition software (MediaCybernetics, MD), such as to fabricate the microstructures shown in the examples of FIG. 1A, 1B, 1C, 3A, 3B, or 3C. In such an example, the shape of the microstructure fabricated in each cycle can be defined by the shape of an aperture diaphragm. The resolution can be defined by the dimension of the aperture projected onto the focal plane. To define a desired pattern, exposure positions can be pre-programmed in the acquisition software, such as by using its "User defined points" function. Exposures can be carried out, such as with a Mercury arc lamp at 365 nanometers wavelength for a duration of one second. After flushing out the unpolymerized material, such as with Trizma buffer or ethanol, we can move to the next exposure point and repeat the exposure until all the desired exposure locations are exposed. The final structures can be examined under the same microscope.

Figure 3B:
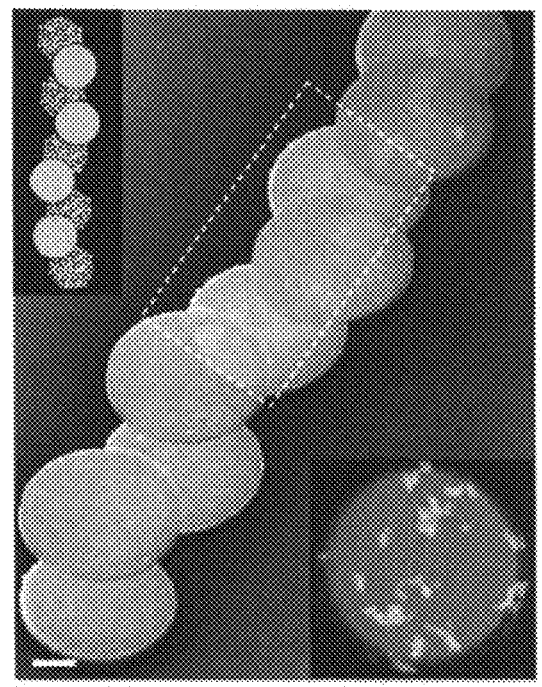
Figure 3C:
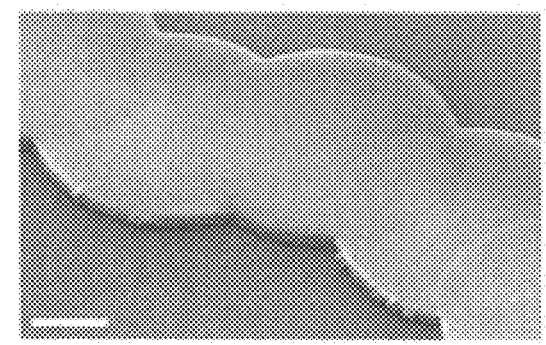

FIGS. 3A, 3B, and 3C illustrate examples of fabrication and characterization of microstructures made of materials with different chemical and bead compositions. The microstructures in these examples can be fabricated using an epifluorescence microscope with a motorized stage. To match the emission spectrum of the mercury lamp, we can use Irgacure 2959 (a UV-sensitive photoinitiator) to carry out photopolymerization at 365 nm. The objective lens (40×, 1.25 N.A.) can be used to project the ultraviolet light through a small aperture diaphragm (e.g., 20 µm in diameter) onto the photocurable material, inducing rapid radical-induced photopolymerization (e.g., ~2 seconds).

Example of Scanning Electron Microscopy (Sem) Analysis

In an illustrative example, PEG-DA microstructures such as shown in the example of FIG. 3B can be fabricated, such as described above, optionally removed from the microfluidic target structure 100, optionally sputter-coated with gold-palladium to a thickness of 3-5 nm, and then optionally imaged, such as by using a Hitachi 4700 SEM at 2-5 kV emission accelerating voltage.

FIG. 3A shows an example of a merged fluorescence image (e.g., red and blue) of examples of microstructures of three different materials: TMP-TA (e.g., red disks), TMPeg-TA (e.g., blue disks), and HEX-DA (e.g., red rectangles). The different shapes of the microstructures can be achieved with different aperture diaphragms, in this example. Total fabrication time can be 8 minutes in this example.

FIG. 3B shows an example of a scanning electron micrograph (SEM) image at 210× magnification of an example of a disk-based microstructure that alternates with disks made of PEG-DA and PEG-DA doped with 5 µm-diameter microbeads. Total fabrication time can be 5 minutes in this example. Insets in FIG. 3B include: (left upper) schematic pattern of an example of an intended design; (lower right) fluorescence image of an example of 0.5 µm-diameter fluorescent microbeads inside a PEG-DA microstructure.

FIG. 3C shows an example of a SEM image at 350× magnification of the dotted region in FIG. 3B. Because, in this example, the microstructures are sandwiched flush between two glass plates, microbeads are expected to be observed only on the sides of the microstructures, as observed. Schematic diagrams of designed exposure patterns for all cycles are provided in FIGS. 5B and 5C. All scale bars=50 µm in the example of FIG. 3C.

Example of Mechanical Testing

In an illustrative example, to measure the range of stiffnesses of the acrylate-based or other fabricated materials, such as under the experimental conditions of the study described above, we can perform an unconfined compression test, such as using an Instron 5848 Microtester equipped with a 10 N load cell and ceramic platens. In an experimental example, hydrogel discs (e.g., diameter: 9 mm, thickness: ~1 mm) such as made of 10%, 25%, and 50% w/v polymer were cast in a PDMS mold sandwiched between glass slides and photopolymerized under an ultraviolet lamp for 1 minute. The samples were stored in ethanol for two days before testing. Using the integrated Instron software, the platens were brought into contact with the sample until a 10 gf (0.098 N) preload was reached and then held for 5 minutes to obtain the equilibrium preload value. For more compliant gels (e.g., 10% w/v), a 5 gf preload was used. The height under preload was determined for each sample from the relative position of the platens. For stiffer gels (e.g., 25% and 50% w/v), a 2% strain was applied at a rate of 0.001 mm/s and held for 2 hours to obtain the equilibrium load value. For 10% w/v gels a 15% strain was used. The Young's modulus can be calculated by dividing the difference between the preload and equilibrium load by the sample area multiplied by the percent strain.

$$Young's\,Modulus = \frac{(Eq.\,Load - Preload)/Area}{\%\,Strain}$$

Example of Cell Viability Assay

In an illustrative experimental example, fibroblasts were suspended in 10% w/v PEG-DA, 0.1% w/v Irgacure 2959, 0.3% v/v 1-vinyl-2-pyrrolidone at a cell density of $1\times10^6$ cells/mL. The cell-prepolymer mixture was polymerized under UV light at 365 nanometer wavelength and then covered with a thin layer of cell medium (e.g., cover enough to submerge the polymerized structure). The survival rate of fibroblasts were quantified by LIVE/DEAD cytotoxicity kit immediately after polymerization. Fluorescent images were taken at five different locations across the surface of the gel and the number of viable cells was counted. Percentage of viable cells was determined with respect to the number of dead cells counted from the same sample.

FIG. 4 illustrates an example of fluorescence image of mammalian cells inside an example of a 3D composite microstructure. In this example, the patterned microstructure include PEG-DA that encapsulated 3T3 fibroblasts (e.g., labeled with CellTracker orange) interlinked with a vessel-like acellular hydrogel network (e.g., PEG-DA labeled with rhodamine B). For cell patterning in 3D hydrogels, in this example, the fibroblasts can be embedded in a PEG-DA prepolymer with Eosin Y as photoinitiator, and photopolymerized at 514 nm. The less-orderly design of this cellular hydrogel microstructure was intended to mimic in vivo-like structures. In the example of FIG. 4, the scale bar=50 µm.

FIG. 6 shows an example of 3T3 fibroblasts encapsulated in PEG-DA with LIVE/DEAD cytotoxicity assay stain. It should be noted that radical generation during the excitation of photoinitiator can cause cell death in at least one other approach. However, we examined the cytotoxic effect of our approach of photocrosslinking PEG-DA by Irgacure 2959 at 365 nm. We observed a 95% fibroblast viability.

Example of Resolution Measurement

Figure 7:
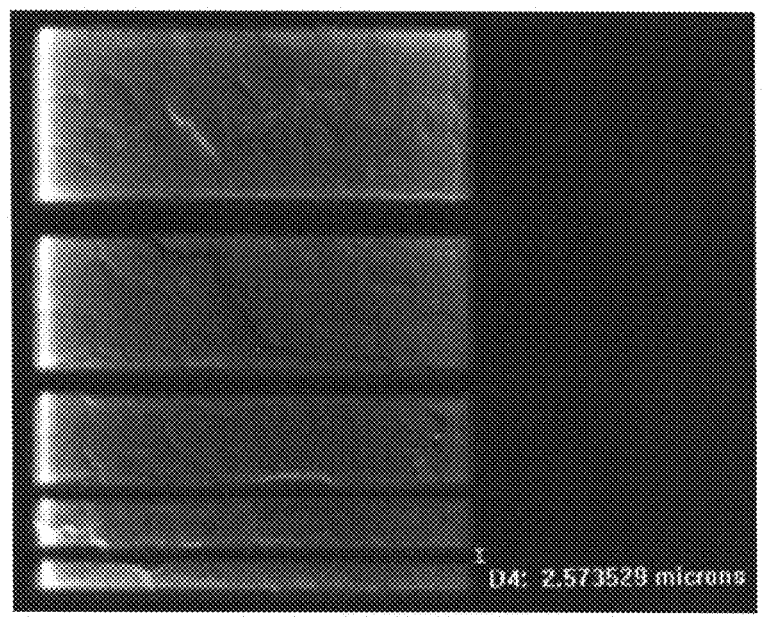
FIG. 7 shows an example of a resolution measurement of a microstructure fabricated with a confocal laser scanning microscope.

FIG. 7 shows an example of a resolution measurement of a microstructure fabricated with a confocal laser scanning microscope. Using ImagePro digital image analysis software, we measured a minimum spatial resolution of 2.5 µm using a 10×0.5 numerical aperture air objective in the confocal system. Using a fluorescent microscope (e.g., Leica) with a 40×1.25 numerical aperture oil immersion objective, we obtained a resolution of 40 µm, which was the projected diameter of the smallest aperture.

Examples of Compositions, Solvents, Etc

Table 1 describes examples of combinations of fluorescent dyes or beads that can be used during fabrication of microstructures such as shown in the examples of FIGS. 1A-1C, 2A-2C, 3A-3C, and 4. In the example of Table 1, cycle numbers correspond to the structures schematized in FIGS. 5A-5G.

TABLE 1

| Figure | Cycle* | Polymer composition | | Solvent |
|---|---|---|---|---|
| FIG. 1C | 1, 7, 13, 19 | 3, 2.5, 2, 1.5 mM Fluorescein | 40% w/v PEG-DA, 2% w/v I2959, 0.4% v/v NVP. | 10X TRIZMA buffer (pH 8) |
| | 2, 8, 14, 20 | 3, 2.5, 2, 1.5 mM Rhodamine B | | |
| | 3, 9, 15, 21 | 3, 2.5, 2, 1.5 mM Hoechst 33342 | | |
| | 4, 10, 16, 22 | 2.5, 2, 1.5, 1 mM Fluorescein + Rhodamine B | | |
| | 5, 11, 17, 23 | 2.5, 2, 1.5, 1 mM Fluorescein + 2.5, 2, 1.5, 1.5 mM Hoechst 33342 | | |
| | 6, 12, 18, 24 | 2.5, 2, 1.5, 1 mM Rhodamine B + 2.5, 2, 1.5, 1.5 mM Hoechst 33342 | | |
| FIG. 2A | 1 | 1 mM Fluorescein | 40% w/v PEG-DA, 200 uM Eosin Y, 0.4% v/v NVP, 1.5% v/v Triethanolamine. | 1X PBS |
| | 2 | 1 mM Rhodamine B | | |
| FIG. 2B/2C | 1 | 1 mM Fluorescein | | |
| | 2 | 1 mM Rhodamine B | | |
| | 3 | 1 mM 7-(diethylamino) coumarin-3-carboxylic acid | | |
| FIG. 3A | 1 | 1 mM Rhodamine B | 50% w/v TMPTA, 3% w/v I2959, 0.4% v/v NVP | 100% Ethanol |
| | 2 | 1 mM 7-(diethylamino) coumarin-3-carboxylic acid | 50% w/v TMPegTA, 3% w/v I2959, 0.4% v/v NVP | |
| | 3 | 1 mM Rhodamine B | 50% w/v HEX-DA, 3% w/v I2959, 0.4% v/v NVP | |
| FIG. 3B | 1 | With 0.5 µm beads | 0.27 mM Rhoadmine B, 92% w/v TMPTA, 2% w/v I2959, 0.4% v/v NVP | 100% Ethanol |
| | 2 | No beads | | |
| FIG. 4 | 1 | 10% w/v PEG-DA, 100 µM Eosin Y, 1.5% v/v Triethanolamine, 0.4% v/v NVP, 5 × 10$^6$ cells/mL. | | 3T3 serum media |
| | 2 | 10% w/v PEG-DA, 100 µM Eosin Y, 1.5% v/v Triethanolamine, 0.4% v/v NVP, 1 mM Rhodamine B. | | |

Examples of Additional Applications

Examples of some possible applications for the fabricated microstructures described above include, among other things, engineered tissues, structures for examining tumor or other cell migration or metastasis, monolithic or composite drug-delivery polymeric matrix, such as to deliver the same or different drugs at the same or different drug delivery rates in different regions of a composite microstructure drug delivery matrix, or to provide a spatially-defined or spatially directed drug delivery matrix, or in microelectromechanical structures (MEMS) applications, such as to fabricate one or more microcomponents that can be mechanically or otherwise actuated.

Additional Notes

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown and described. However, the present inventors also contemplate examples in which only those elements shown and described are provided.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code may be tangibly stored on one or more volatile or non-volatile computer-readable media during execution or at other times. These computer-readable media may include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. A method for forming a composite structure, the method comprising:
    flowing a first precursor solution into an assembly region;
    exposing at least a first portion of the assembly region to light such that the first precursor solution in at least said first portion of the assembly region is polymerized into a first polymer section;
    flowing a second precursor solution into the assembly region; and
    exposing at least a second portion of the assembly region to light such that the second precursor solution in at least said second portion of the assembly region is polymerized into a second polymer section,
    wherein the first polymer section has a material property different from that of the second polymer section, and
    the exposing at least a first portion to light and the exposing at least a second portion to light are performed using light from a confocal laser scanning microscope.

2. The method of claim 1, wherein the material property is a porosity of the respective polymer section.

3. The method of claim 1, wherein the material property is a stiffness of the respective polymer section.

4. The method of claim 1, wherein the first polymer section has a different material composition from that of the second polymer section.

5. The method of claim 1, wherein the first and second polymer sections form a composite, anisotropic hydrogel structure.

6. The method of claim 1, wherein said assembly region is a region of a microfluidic channel having a dimension less than 1 mm.

7. The method of claim 1, wherein the first and second precursor solutions include respective prepolymers and photoinitiators.

8. The method of claim 1, wherein the first precursor solution or the second precursor solution includes a polyethylene glycol (PEG) based prepolymer.

9. The method of claim 1, wherein the first precursor solution or the second precursor solution includes a polyethylene glycol based prepolymer with adhesion peptides.

10. The method of claim 1, further comprising seeding at least one of the first and second polymer sections with living cells.

11. The method of claim 1, wherein the assembly region has a height, and at least one of the first and second polymer sections has a height in a direction parallel to said assembly region height that is less than said assembly region height.

12. The method of claim 1, wherein at least a portion of the first polymer section overlaps at least a portion of the second polymer section in plan view.

* * * * *